(12) United States Patent
Chiang et al.

(10) Patent No.: US 10,134,873 B2
(45) Date of Patent: Nov. 20, 2018

(54) SEMICONDUCTOR DEVICE GATE STRUCTURE AND METHOD OF FABRICATING THEREOF

(71) Applicant: Taiwan Semiconductor Manufacturing Co., Ltd., Hsin-Chu (TW)

(72) Inventors: Hsin-Che Chiang, Taipei (TW); Ju-Yuan Tzeng, New Taipei (TW); Chun-Sheng Liang, Changhua (TW); Shu-Hui Wang, Hsinchu (TW); Kuo-Hua Pan, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/355,901

(22) Filed: Nov. 18, 2016

(65) Prior Publication Data
US 2018/0145149 A1  May 24, 2018

(51) Int. Cl.
| H01L 29/66 | (2006.01) |
| H01L 21/02 | (2006.01) |
| H01L 29/40 | (2006.01) |
| H01L 29/51 | (2006.01) |

(52) U.S. Cl.
CPC .... *H01L 29/66545* (2013.01); *H01L 21/0228* (2013.01); *H01L 21/02183* (2013.01); *H01L 29/401* (2013.01); *H01L 29/517* (2013.01); *H01L 29/518* (2013.01)

(58) Field of Classification Search
CPC ......... H01L 21/76814; H01L 21/76822; H01L 21/76828; H01L 21/76841; H01L 21/76843; H01L 21/76846; H01L 21/7685; H01L 21/76852; H01L 21/76853; H01L 21/76858; H01L 29/66007–29/66969; H01L 29/49–29/518; H01L 29/66545; H01L 21/22–21/228; H01L 29/517; H01L 21/823462; H01L 29/401; H01L 21/2254
See application file for complete search history.

(56) References Cited

U.S. PATENT DOCUMENTS

| 6,180,522 B1 * | 1/2001 | Hong ................ H01L 21/28518 257/E21.165 |
| 8,487,378 B2 | 7/2013 | Goto et al. |
| 8,729,634 B2 | 5/2014 | Shen et al. |
| 8,826,213 B1 | 9/2014 | Ho et al. |
| 8,887,106 B2 | 11/2014 | Ho et al. |
| 9,548,372 B2 * | 1/2017 | Cheng ............ H01L 21/823842 |
| 2012/0269962 A1 * | 10/2012 | Blomberg ............... C23C 16/34 427/126.3 |

(Continued)

*Primary Examiner* — Scott B Geyer
(74) *Attorney, Agent, or Firm* — Haynes and Boone, LLP

(57) ABSTRACT

A method of forming a gate structure of a semiconductor device including depositing a high-k dielectric layer over a substrate is provided. A dummy metal layer is formed over the high-k dielectric layer. The dummy metal layer includes fluorine. A high temperature process is performed to drive the fluorine from the dummy metal layer into the high-k dielectric layer thereby forming a passivated high-k dielectric layer. Thereafter, the dummy metal layer is removed. At least one work function layer over the passivated high-k dielectric layer is formed. A fill metal layer is formed over the at least one work function layer.

20 Claims, 14 Drawing Sheets

(56) References Cited

U.S. PATENT DOCUMENTS

| | | | |
|---|---|---|---|
| 2013/0113053 A1* | 5/2013 | Lin | H01L 21/28088 |
| | | | 257/411 |
| 2014/0282326 A1 | 9/2014 | Chen et al. | |
| 2015/0035079 A1* | 2/2015 | Xie | H01L 27/088 |
| | | | 257/390 |
| 2015/0132938 A1* | 5/2015 | Ahmed | H01L 29/517 |
| | | | 438/591 |
| 2016/0351675 A1* | 12/2016 | Patil | H01L 21/823842 |

* cited by examiner

SEMICONDUCTOR DEVICE GATE STRUCTURE AND METHOD OF FABRICATING THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

One development in some IC designs has been the replacement of traditional polysilicon gates with high-k/metal gates (HK/MG). A typical HK/MG includes a high-k gate dielectric layer, a work function (WF) metal layer, and a low resistance metal filling layer. Such structure is geared toward improving transistor density and switching speed, while reducing switching power and gate leakage. The quality and/or reliability of the HK/MG can be an important metric for a semiconductor device.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
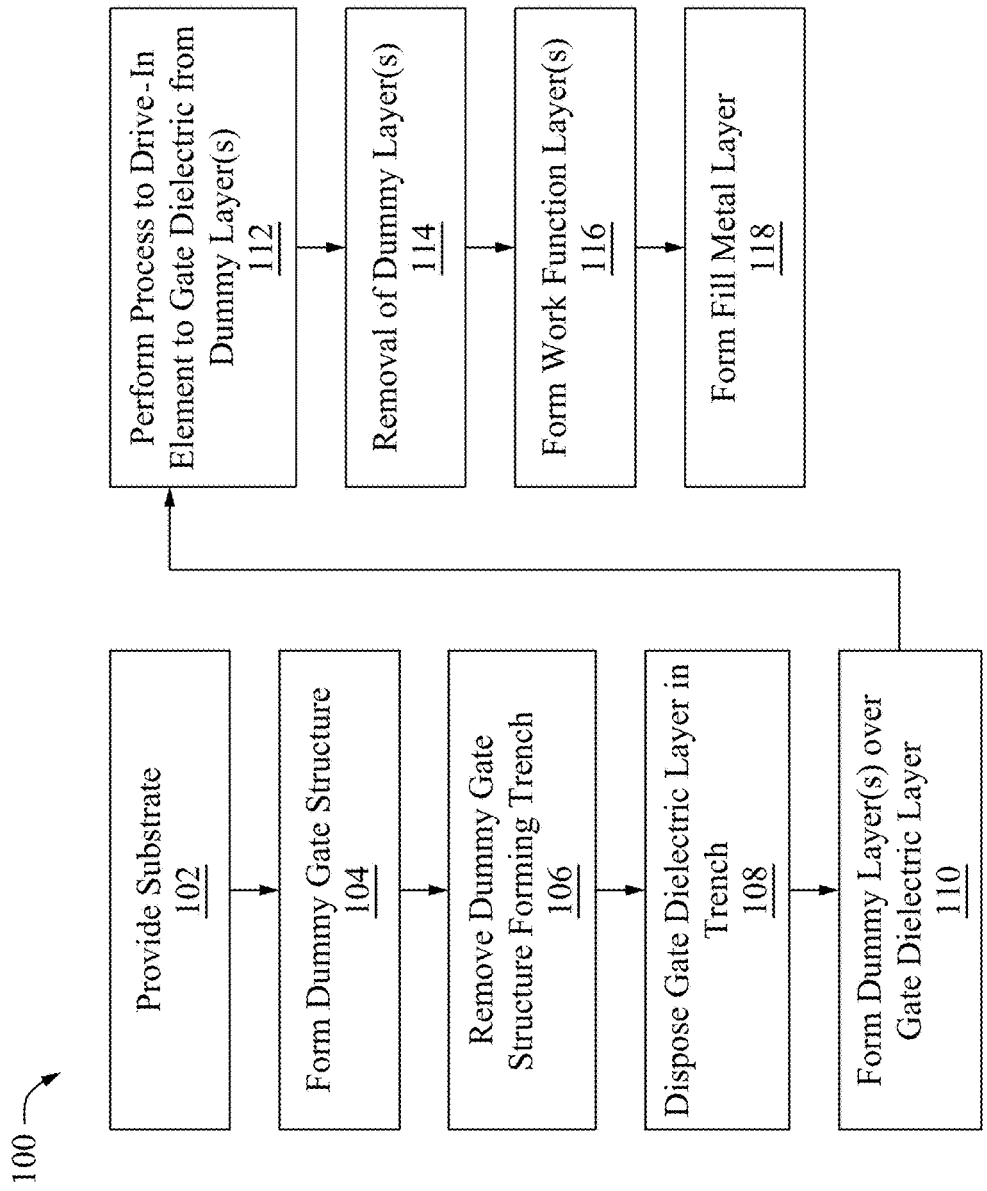
FIG. 1 illustrates a block diagram of a method of fabricating a semiconductor device according with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and fabrication. More particularly, the present disclosure is related to a metal gate, such as high-k metal gate (HK/MG), for field-effect transistors (FETs), and methods of forming the same.

Referring to FIG. 1, shown therein is a method 100 of forming a semiconductor device, such as the device 200 described below with respect to FIGS. 2-11, according to various aspects of the present disclosure. The method 100 is an example, and is not intended to limit the present disclosure beyond what is explicitly recited in the claims. Additional operations can be provided before, during, and after the method 100, and some operations described can be replaced, eliminated, or relocated for additional embodiments of the method. The method 100 is described below in conjunction with FIGS. 2-11. FIGS. 2-11 show cross-sectional views of portions of an exemplary semiconductor device 200. The semiconductor device may be a p-type field effect transistor (FET) or an n-type FET. In some embodiments, one or more steps of the method 100 form a PFET and simultaneously, corresponding elements of an NFET.

In some embodiments, the device 200 is a fin-type field effect transistor (FinFET) device. The gate structure described below may be formed interfaces a plurality of sides of a fin element (e.g., semiconductor fin such as silicon) extending from the semiconductor substrate. In some embodiments, the device 200 is a planar transistor. The illustrated device 200 does not necessarily limit the embodiments to any type of devices, any number of devices, any number of regions, or any configuration of structures or regions. For example, the provided subject matter can be applied in fabricating planar FET devices and other type of multi-gate FET devices for reducing gate contact resistance and for enlarging process windows during gate contact fabrication. Furthermore, the device 200 may be an intermediate device fabricated during the processing of an IC, or a portion thereof, that may comprise static random access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

The method 100 begins at block 102 where a substrate is provided. Illustrated in the exemplary embodiment of FIG. 2, a substrate 202 is provided. In an embodiment, the substrate 202 is a silicon substrate. Alternatively, the substrate 202 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 202 is a semiconductor-on-insulator (SOI) substrate. The substrate 202 may include epitaxial features, be strained for performance enhancement, and/or have other suitable enhancement features. The substrate 202 may include a fin extending from the substrate 202 on and around which the gate structure described below is formed. The fin includes semiconductor material(s) and is suitable for forming a FinFET device thereon, such as a p-type FinFET or an n-type FinFET. The fin may be fabricated using suitable processes including photolithography and etch processes.

The substrate 202 includes an isolation structure 206 also referred to as a shallow trench isolation feature. The isolation structure 206 may be formed of silicon oxide, silicon nitride, silicon oxynitride, fluoride-doped silicate glass (FSG), a low-k dielectric material, and/or other suitable insulating material. In an embodiment, the isolation structure 206 is formed by etching trenches in the substrate 202. The trenches may then be filled with an isolating material, followed by a chemical mechanical planarization (CMP) process. The isolation structure 206 may also comprise field oxide, LOCal Oxidation of Silicon (LOCOS), and/or other suitable structures. The isolation structure 206 may include a multi-layer structure, for example, having one or more thermal oxide liner layers.

The isolation structure 206 defines an active region 204 of the substrate 202. A channel region, source region, and drain region (each associated with the gate structure described below) may be formed within the active region 204. The active region 204, or portions thereof, may be suitably doped to provide p-type or n-type devices.

The method 100 then proceeds to block 104 where a dummy gate structure is formed on the substrate. This step is indicative of a replacement gate process; however, other embodiments of the method 100 are possible including where the metal gate structure is formed on the substrate and patterned in a gate-first process. In such embodiments, step 104 and 106 may be omitted and the gate dielectric layer (e.g., block 108) and subsequent layers (e.g., blocks 110, 112, 112, 116 and 118) may be formed on the substrate and then patterned to form a gate structure.

Figure 2:
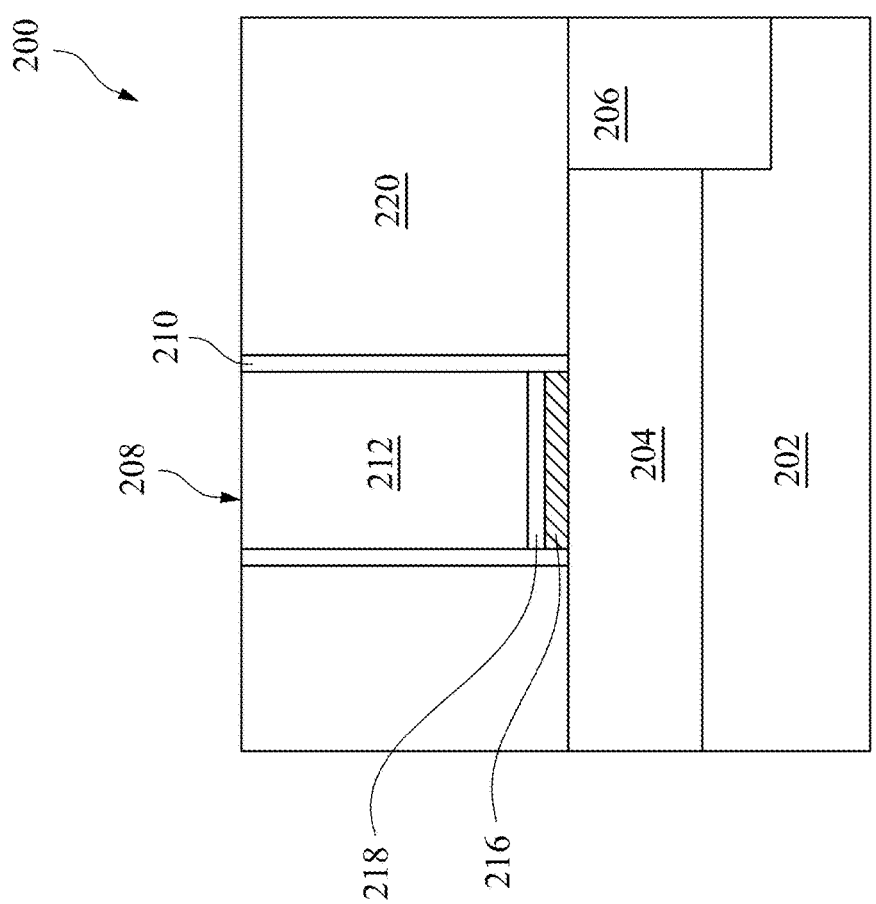
FIGS. 2-10 illustrate a cross-sectional diagram of a semiconductor device corresponding to one or more steps of the method of FIG. 1 and aspects of the present disclosure.

FIG. 2 is illustrative of a dummy gate structure 208. The dummy gate structure 208 includes a dummy electrode 212. The dummy electrode 212 may be polysilicon.

In some embodiments, a gate dielectric 218 is a dummy dielectric layer that is subsequently removed when removing the dummy gate structure and another gate dielectric layer (e.g., layer 402, FIG. 4) is formed in the resultant trench. In some embodiments, the gate dielectric layer 218 is the gate dielectric layer for the final device 200 and is not replaced; in other words, gate dielectric 218 is the same layer as gate dielectric 402, discussed below and the passivation processes described below are performed upon the gate dielectric layer 218. An interfacial layer 216 may underlie the gate dielectric layer 218. Each of the gate dielectric layer 218 and the interfacial layer 216 are described in further detail below.

The gate dielectric layer 218 may include silicon oxide, or a high-k dielectric material such as hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate (Sr-$TiO_3$), other suitable metal-oxides, or combinations thereof. The gate dielectric layer 218 may be formed by CVD, chemical oxidation, thermal oxidation processes, ALD and/or other suitable methods.

The interfacial layer 216 may include a dielectric material such as silicon oxide layer ($SiO_2$) or silicon oxynitride (SiON), and may be formed by chemical oxidation, thermal oxidation, ALD, CVD, and/or other suitable techniques. In an alternative embodiment, the interfacial layer 216 is omitted.

Gate spacers 210 abut the sidewalls of the dummy gate structure 208. The inner sidewalls of the gate spacer 210 define a trench, as discussed below. The gate spacers 210 may comprise silicon oxide, silicon nitride, silicon carbide nitride (SiCN), silicon oxynitride (SiON), silicon carbide oxynitride (SiCON), or other suitable dielectric material. The gate spacers 210 may be formed by deposition and etching processes. The deposition process may be a chemical vapor deposition (CVD), physical vapor deposition (PVD), atomic layer deposition (ALD), or other suitable deposition techniques. The etching process may be an anisotropic dry etching process in one example.

A dielectric layer 220 is disposed on the substrate adjacent the dummy gate structure 208. In some embodiments, the dielectric layer 220 is deposited and subsequently a planarization process, such as a chemical mechanical polish (CMP), is performed to expose a top surface of the dummy gate structure 208. The dielectric layer 220 may include one or more dielectric materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The dielectric layer 220 may be deposited by a plasma enhanced CVD (PECVD) process, a flowable CVD (FCVD), or other suitable deposition techniques. In an embodiment, the device 200 further includes an etch stop layer (not shown) underneath the dielectric layer 220 and the etch stop layer may comprise silicon nitride, silicon oxide, silicon oxynitride, and/or other materials. The etch stop layer may be referred to as a contact etch stop layer (CESL).

The method 100 then proceeds to block 106 where the dummy gate structure is removed thereby creating a trench. Again, this step is indicative of an embodiment of the method 100 that includes a gate-replacement process. In other embodiments, the dummy gate structure and resulting trench are not used, but the device gate structure deposited onto the substrate and patterned using suitable photolithography and etch processes. In some embodiments however, the method 100 includes a gate-replacement process, the gate spacers 210, which abut the sidewalls of the dummy gate structure 208 (FIG. 2) that is subsequently removed, provide the gate trench 302 between opposing sidewalls of the gate spacers 210.

Figure 3:
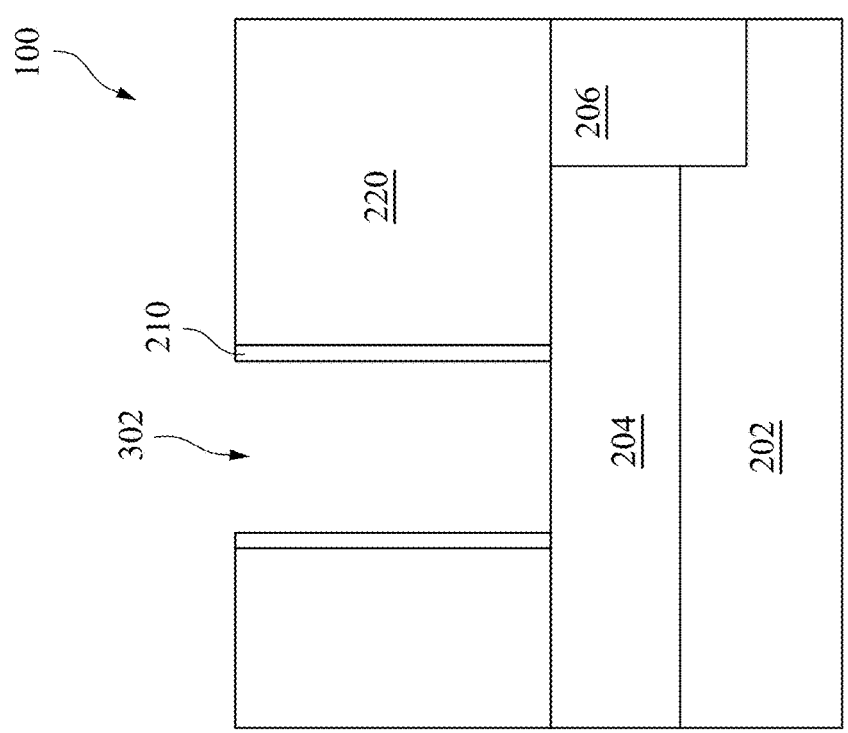

In the illustrated embodiment of FIG. 3, the dummy gate electrode 212, the gate dielectric 218, and interfacial layer 216 are removed in the trench 302. These layers may be removed and re-formed using suitable deposition or growth techniques including as discussed below. In other embodiments, the gate dielectric 218 and/or the interfacial layer 216 may remain within the trench 302 and subsequent layers are formed thereon. Gate trench 302 is formed.

The method 100 then proceeds to block 108 where a gate dielectric layer is disposed in the trench provided by removal of the gate electrode layer. As discussed above, in some embodiments, the dielectric layer formed under the dummy gate electrode is maintained and is disposed in the trench. In some embodiments, a new gate dielectric layer is deposited within the trench.

Figure 4:
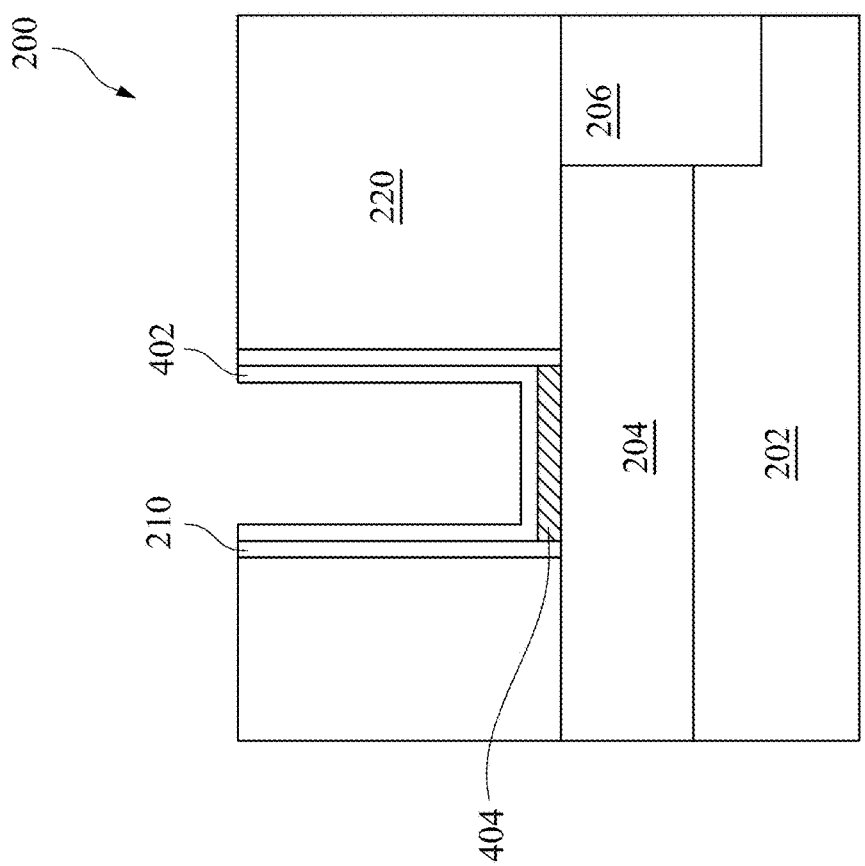

Using the example of FIG. 4, the gate dielectric layer 402 is disposed over a bottom surface and sidewall surfaces of the gate trench 302. In another embodiment, the gate dielectric layer 402 does not extend vertically up the sidewalls of the trench 302, but is configured similar to the gate dielectric layer 218 above. In some embodiments, before the depositing of the gate dielectric layer 402, the method 200 forms an interfacial layer 404 in the gate trench 302 and over a channel region of the active region 204. Continuing with the present embodiment as shown in FIG. 4, the gate dielectric layer 402 is deposited over the interfacial layer 404. The gate dielectric layer 402 may include a high-k dielectric material such as hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof. The gate dielectric layer 402 may be formed by ALD and/or other suitable methods. The interfacial layer 404 may include a dielectric material such as silicon oxide layer ($SiO_2$) or silicon oxynitride (SiON), and may be formed by chemical oxidation, thermal oxidation, ALD, CVD, and/or other suitable techniques. In an alternative embodiment, the interfacial layer 404 is omitted. In some embodiments, gate dielectric 402 is provided by gate dielectric layer 218.

As formed, the gate dielectric layer 402 may have a defect density for example, provided by oxygen vacancies in the dielectric material. These defects can contribute to threshold voltage variations and/or reliability of the device. Passivating these vacancies may be desired, as discussed in further detail below. In some embodiments, the passivation of the gate dielectric layer is performed by driving atoms (e.g., fluorine) from an overlying dummy layer to the gate dielectric to fill the vacancies.

In some embodiments, the method 100 includes forming one or more layers over the gate dielectric layer including, for example, capping layers. In an embodiment, the layers may include metal nitride layers such as, for example, TaN or TiN. Referring to the example of FIG. 5, a first layer 502 and a second layer 504 are formed over the gate dielectric layer 402. In an embodiment, the first layer 502 is titanium nitride (TiN). In some embodiments, the first layer 502 may be referred to as a capping layer. In an embodiment, the second layer 504 is tantalum nitride (TaN).

The method 100 then proceeds to block 110 where one or more dummy layer(s) are formed over the gate dielectric layer. The dummy layer(s) may be sacrificial layers in that the layer(s) are subsequently removed from the substrate.

In some embodiments, the method 100 includes forming a first dummy layer including a composition having a metal and fluorine (MxFy) also referred to as a metal fluoride composition. Fluorinated metal compositions include, but are not limited to, tungsten, aluminum, titanium, tantalum, and/or other metals. For example, in an embodiment, the first dummy layer is an $AlF_3$ layer. In an embodiment, the first dummy layer is $TaF_5$. In an embodiment, the first dummy layer is $TiF_4$. The first dummy layer may be formed by ALD or CVD processes. In an embodiment, the first dummy layer is formed using an ALD process with precursors providing fluorine and metal (e.g., tungsten) sources. The first dummy layer including the metal fluoride composition may be between approximately 10 and 30 angstroms in thickness. In some embodiments, the thickness of the first dummy layer is selected to provide a suitable quantity of fluorine to the dielectric layer.

In some embodiments, the method 100 includes forming a second dummy layer over the first dummy layer. The second dummy layer may be a dummy blocking layer. In an embodiment, the second dummy layer is TiN. In other embodiments, the second dummy layer is omitted. The second dummy layer may be formed by CVD, ALD, and/or other suitable processes. The second dummy layer may be between approximately 5 and 25 Angstroms in thickness. In an embodiment, the second dummy layer is approximately 10 Angstroms.

Figure 5:
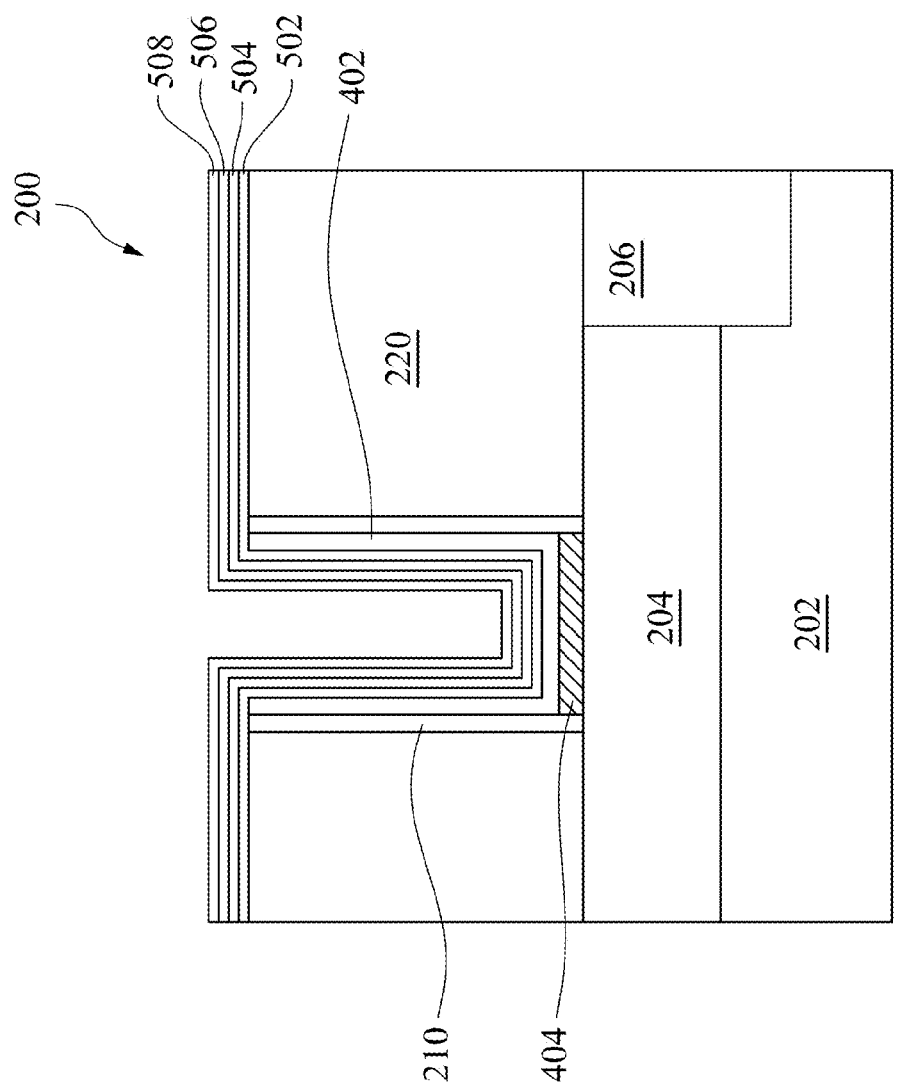

Referring to the example of FIG. 5, the first dummy layer 506 is disposed over the gate dielectric 402. In an embodiment, the first dummy layer 506 is a metal fluoride (MxFy). FIG. 5 also illustrates a second dummy layer 508 disposed over the first dummy layer 506. In an embodiment, the dummy layer 508 is TiN.

After deposition of one or more of the first dummy layer 506, the second dummy layer 508, the first layer 502 and/or the second layer 504, a planarization process (or multiple processes including between deposition of layer(s)) may be performed that removes the layer from a top surface of the dielectric 220, while maintaining the first dummy layer 506, the second dummy layer 508, the first layer 502 and/or the second layer 504 within the gate trench 302.

The method 100 then proceeds to block 112 where a high temperature process is performed. The high temperature process is a process having a greater than room temperature exposure of the substrate sufficient to cause migration or movement of atoms from one layer to another in the formed layers. The high temperature process can drive-in element(s) from certain layers on the stack into underlying layers including the gate dielectric layer. In an embodiment, fluorine from the first dummy layer (e.g., metal fluoride layer) is driven into the gate dielectric layer. In an embodiment, nitrogen is also driven in from one of the first layer, the second layer, or an ambient condition of the high temperature process. The fluorine (as well as the nitrogen in some embodiments if present) can serve to passivate the gate dielectric layer reducing the oxygen vacancies.

The high temperature process may be a thermal anneal (e.g., rapid thermal anneal). In some embodiments, the temperature is between approximately 300 and 700 degrees Celsius. In some embodiments, the duration of the anneal is in the range of seconds or even milliseconds. The anneal may be provided in a vacuum environment. In another embodiment, the anneal may be provided in a nitrogen ambient. The parameters of the anneal process (e.g., temperature, duration, etc) may be selected to provide suitable movement of the fluorine to the gate dielectric layer. The parameters may be determined based on simulation or experimental results.

Figure 6:
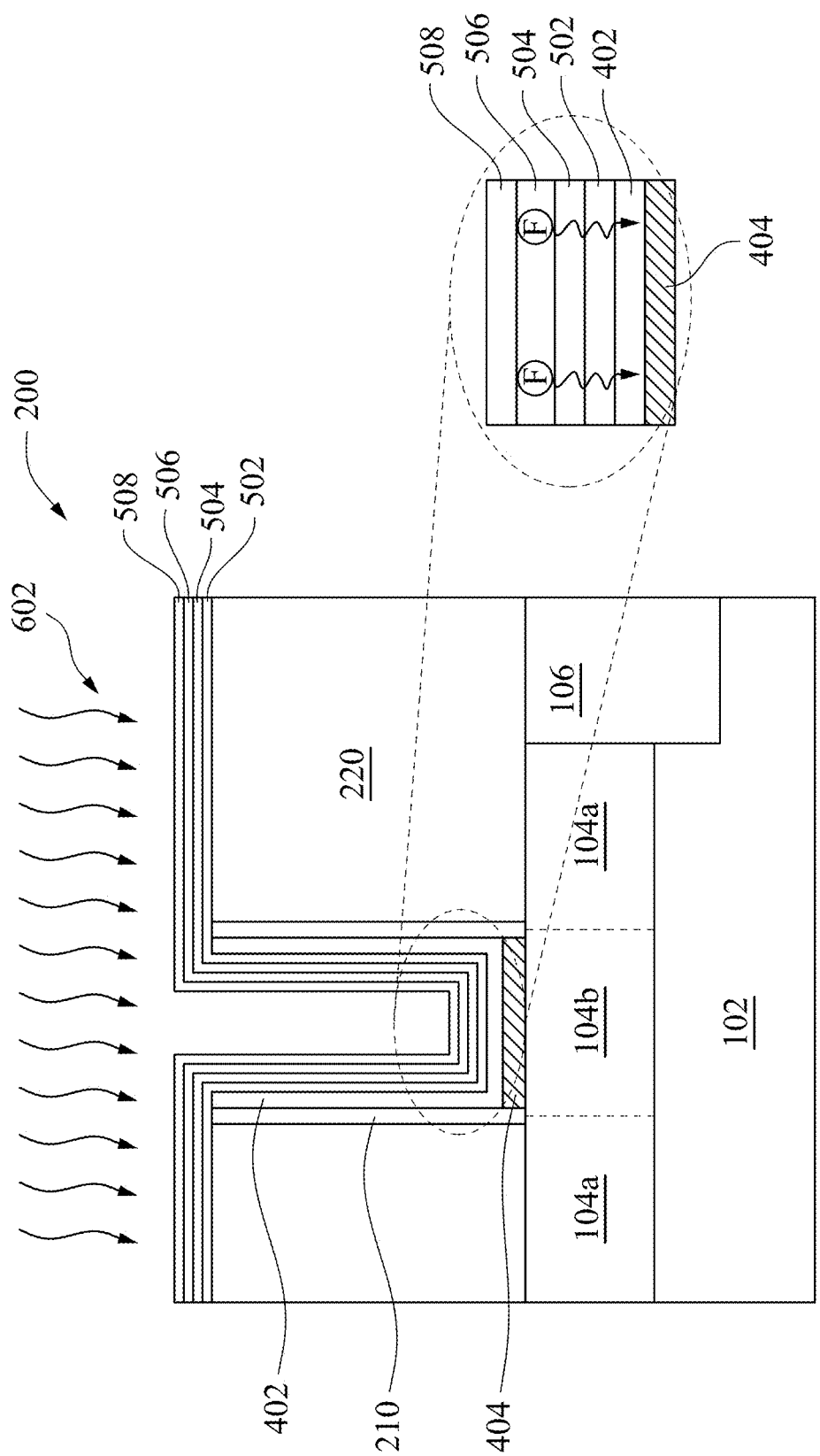

Referring to the example of FIG. 6, anneal conditions 602 (e.g., heat) are provided to the substrate 202. As illustrated by the offset in FIG. 6, fluorine (F) from the first dummy layer 506 is driven from the first dummy layer 506 to the gate dielectric layer 402. Thus, the composition of the gate dielectric layer 402 includes fluorine after the anneal 602. The fluorine may fill vacancies provided in the as-deposited gate dielectric layer 402. The thickness of the gate dielectric layer 402 may remain substantially constant before and after the anneal conditions 602.

In some embodiments, nitrogen transfers from one or more of the layers 502, 504, or 508 into the gate dielectric layer 402.

In some embodiments, the deposition and/or the anneal processes also provide for atoms to migrate to one or more layers (e.g., capping layers) formed on the gate dielectric layer. See the discussion below with reference to the alloy layer formed.

The method 100 then proceeds to block 114 where the dummy layer(s) are removed. In some embodiments, the first and second dummy layers are removed. The dummy layer(s) may be removed by selective dry or wet etching techniques.

Figure 7:
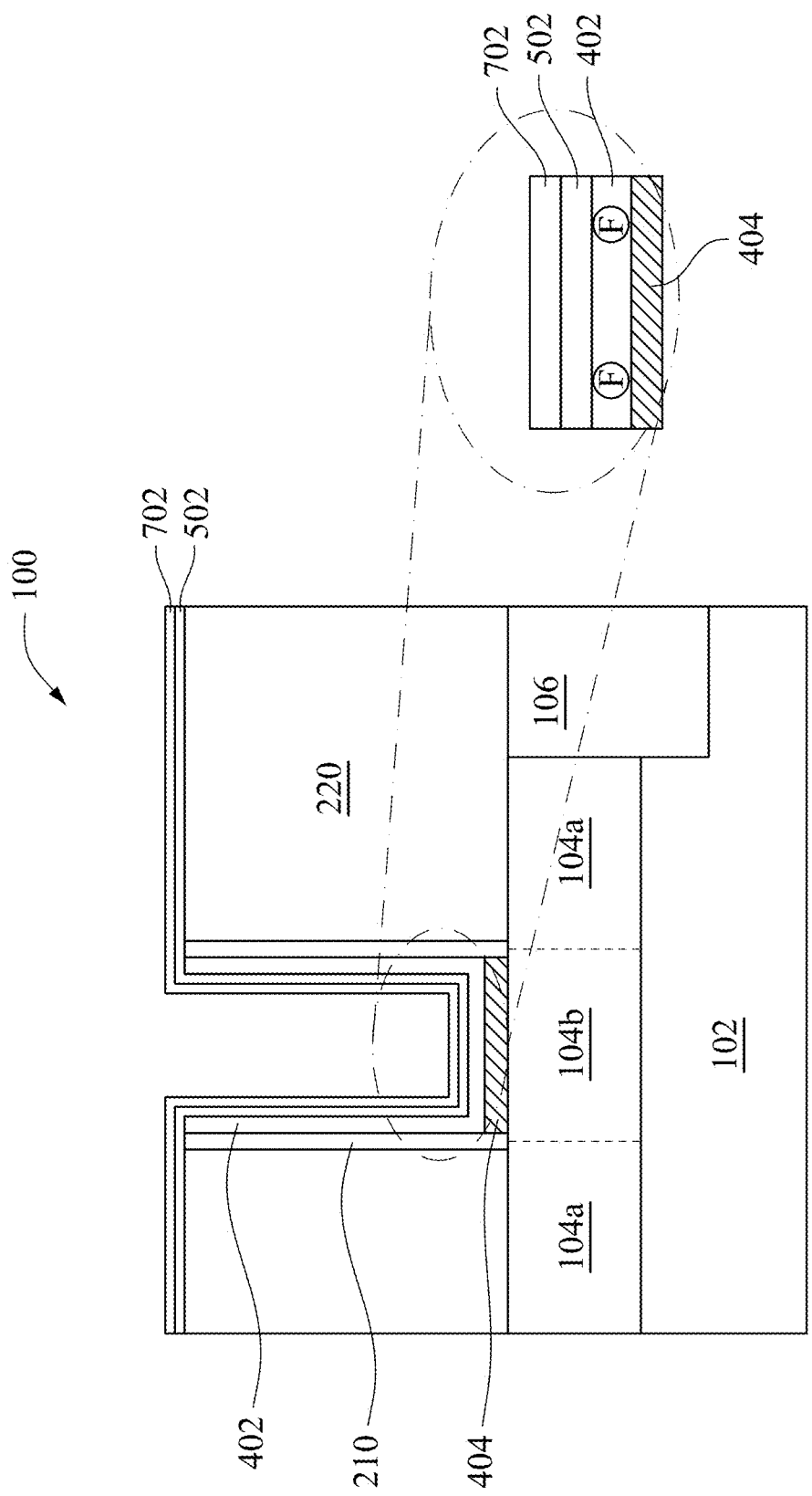

Referring to the example of FIG. 7, the dummy layers 506 and 508 have been removed according to block 114.

It is noted that as illustrated in FIG. 7, during the deposition of the first dummy layer 506 and/or the following anneal 602, the second layer 504 is transformed to an alloy 702. In some embodiments, the second layer 504 is TaN and the alloy layer 702 is a tantalum alloy. In some embodiments, the first dummy layer includes a first metal type (e.g., W) and the alloy layer 702 includes another metal type (e.g., Ta) and the first metal type (e.g., W). For example, in some embodiments, the alloy includes tantalum and tungsten (see also FIG. 14). In some embodiments, the alloy layer 702 is maintained in the completed device 200. In further examples, the alloy layer 702 can not only be maintained, but the layer 702 also contribute to the work function provided by the resultant gate. In some embodiments, the alloy layer 702 is removed (see, e.g., FIG. 11).

Figure 8:
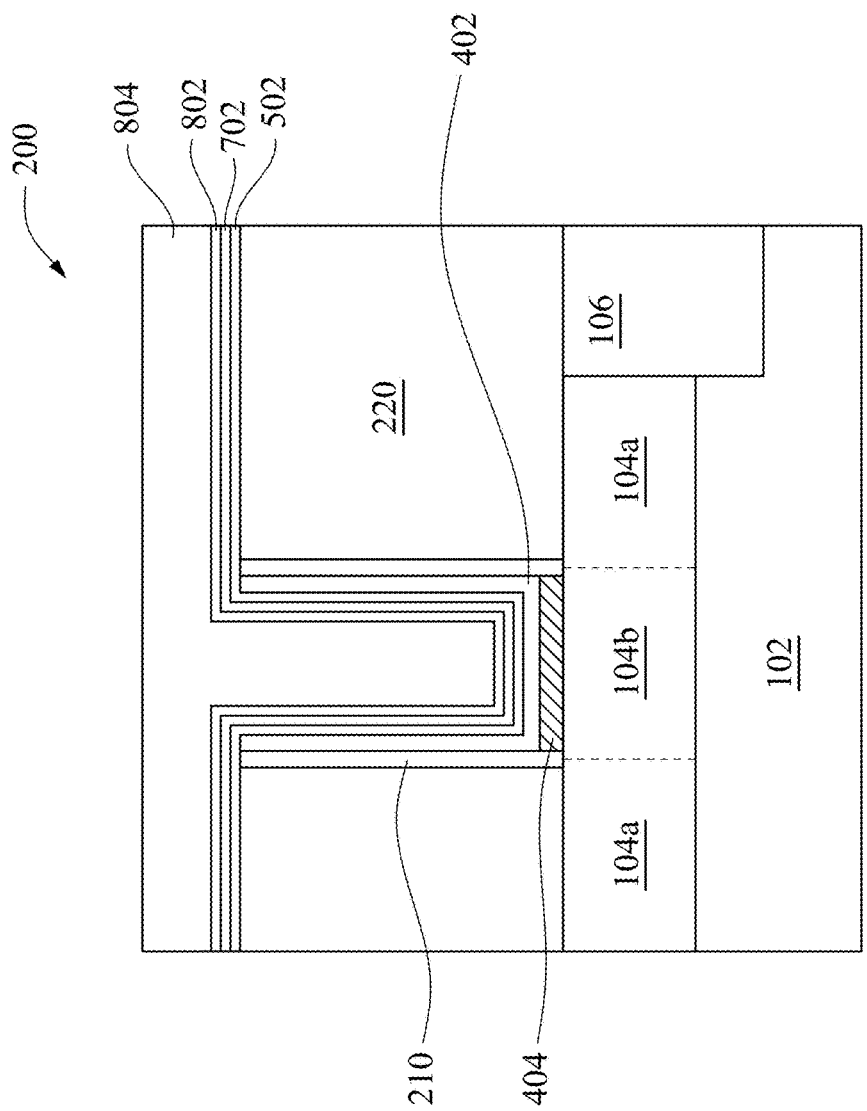
Figure 9:
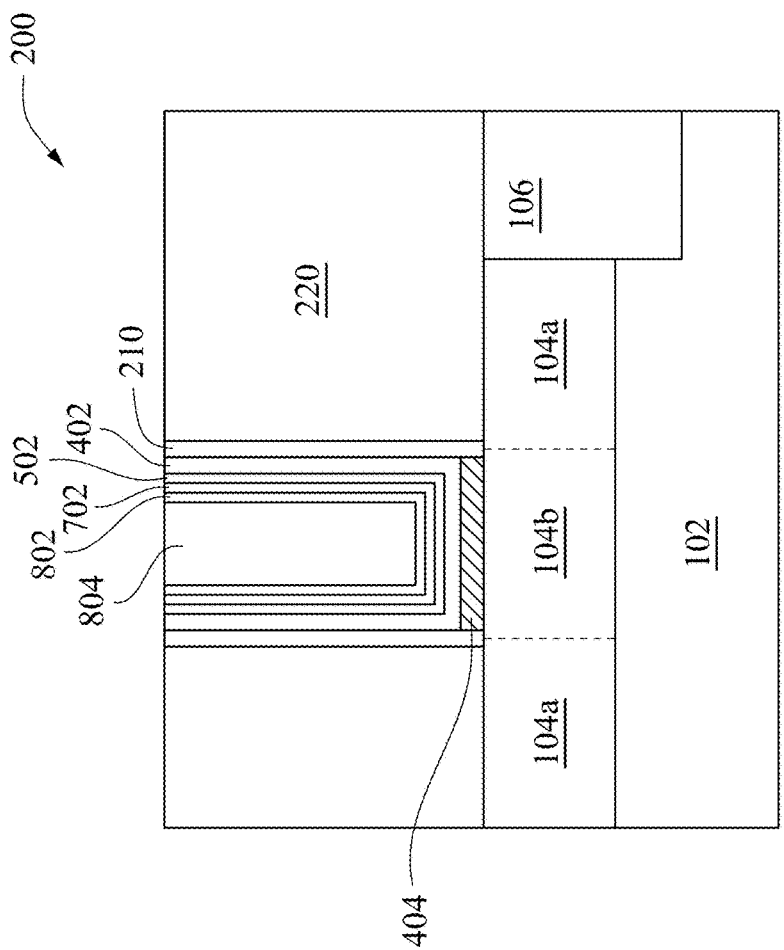

The method 100 then continues to block 116 where one or more work function metal layers are formed. In an embodiment, a plurality of work function metal layers is formed, for example, in some embodiments, between two and six metal work function layers are formed. However, any number of work function layers is understood to be within the scope of the present discussion. As illustrated in the example of FIG. 8, in an embodiment, the method 100 deposits a gate WF layer 802 over the bottom and sidewalls of the gate trench, after removal of the dummy layers (see, layers 506 and 508 above). The gate WF layer 802 is deposited over the gate dielectric layer 402 and partially fills the gate trench. The gate WF layer 802 may be a p-type or an n-type work function layer depending on the type of the device 200. The p-type work function layer comprises a metal with a sufficiently large effective work function, selected from but not restricted to the group of titanium nitride (TiN), tantalum nitride (TaN), ruthenium (Ru), molybdenum (Mo), tungsten (W), platinum (Pt), or combinations thereof. The n-type work function layer comprises a metal with a sufficiently low effective work function, selected from but not restricted to the group of titanium (Ti), aluminum (Al), tantalum carbide (TaC), tantalum carbide nitride (TaCN), tantalum silicon nitride (TaSiN), or combinations thereof. The gate WF layer 802 may include a plurality of layers each providing a suitable n-type or p-type work function for the resultant gate. Each of a plurality of WF layers may have a different composition. The gate WF function layer 802 may be deposited by CVD, PVD, and/or other suitable processes.

The method 100 then proceeds to block 118 where the method 100 deposits a metal filling layer (fill layer) over the WF layer(s). The metal fill layer can fill the space left in the gate trench. As illustrated in FIG. 8, the method 100 in an embodiment deposits a metal filling layer 804 in the gate trench. The metal filling layer 804 may include aluminum (Al), tungsten (W), cobalt (Co), copper (Cu), and/or other suitable materials. The metal filling layer 804 may be deposited by CVD, PVD, plating, and/or other suitable processes.

In an embodiment, the block 118 further includes a CMP process that removes excessive metal material outside of the gate trench and planarizes a top surface of the device 200. As a result, a top surface of the metal filling layer 804 is substantially coplanar with the surface of the dielectric layer 220. See FIG. 9.

In some embodiments, the method 100 continues to include forming a gate contact over the metal filling layer.

Figure 10:
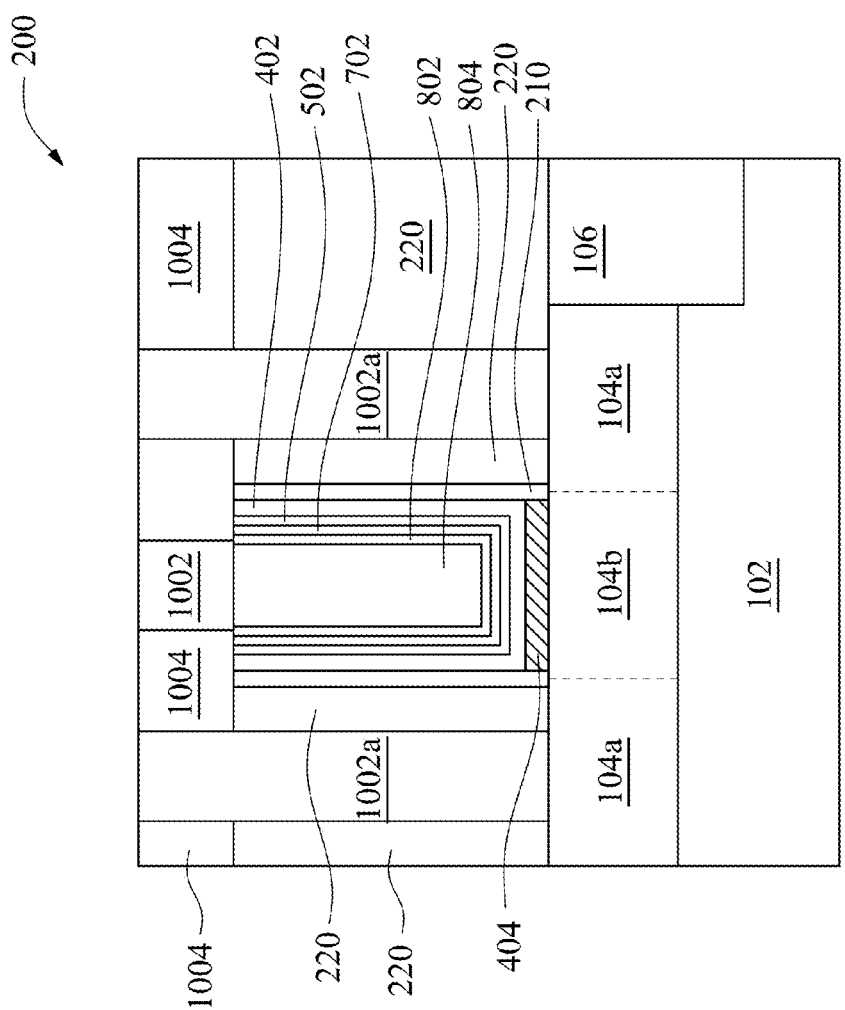

Referring to FIG. 10, the gate contact 1002 penetrates a dielectric layer 1004 and electrically contacts the metal filling layer 804. In an embodiment, this operation involves a variety of processes including deposition, CMP, photolithography, and etching processes. For example, the dielectric layer 1004 is formed; the dielectric layer 1004 may include a dielectric material similar to that of the dielectric layer 220 and may be deposited by a PECVD process, a CVD process, or other suitable deposition techniques. In embodiments, the dielectric layer 1004 may include one or more material layers.

In an embodiment, the gate contact 1002 includes a barrier layer and a metal via layer over the barrier layer. The barrier layer may comprise tantalum (Ta), tantalum nitride (TaN), or another suitable metal-diffusion barrier material; may be deposited using CVD, PVD, ALD, or other suitable processes. The metal via layer uses a conductive material such as aluminum (Al), tungsten (W), copper (Cu), cobalt (Co), combinations thereof, or other suitable material; and can be deposited using a suitable process, such as CVD, PVD, plating, and/or other suitable processes. In some embodiments, contacts 1002a to source and drain regions (illustrated as active area 104a and 104b) may also be formed.

The method 100 may further proceed to additional steps in the fabrication of the device. For example, forming metal interconnects connecting multiple components (e.g., p-type FinFETs, n-type FinFETs, other types of FETs, resistors, capacitors, and inductors) of the device 200 to form a complete IC.

Figure 11:
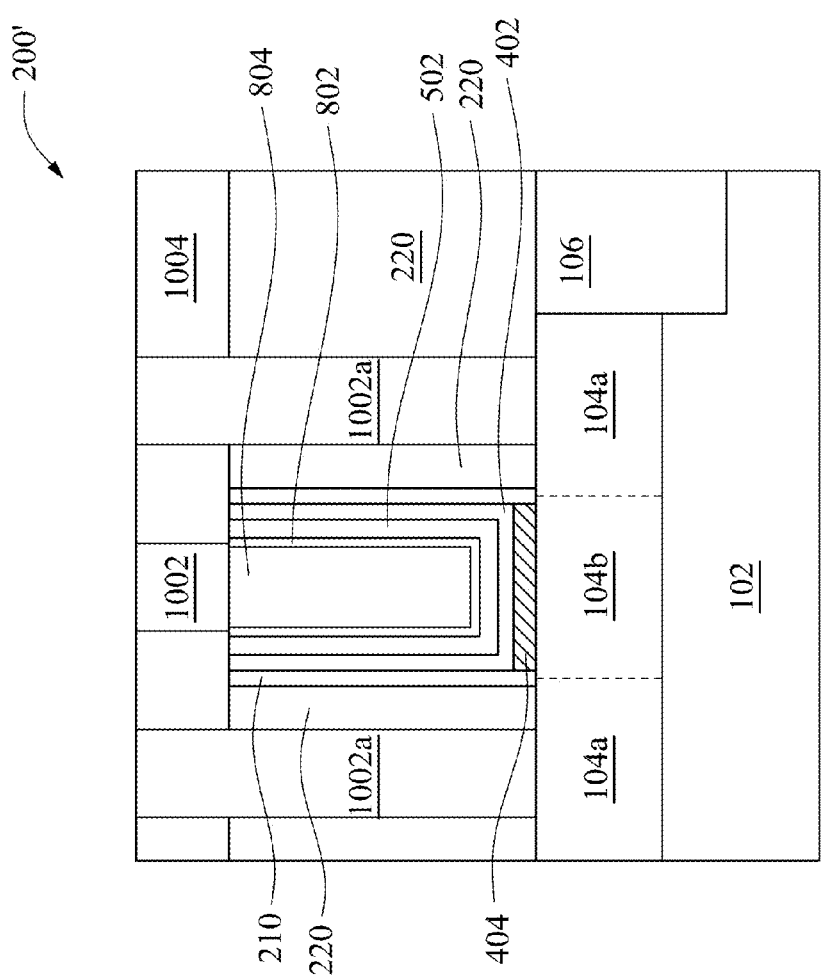
FIG. 11 illustrate a cross-sectional diagram of another semiconductor device, according to aspects of the present disclosure.

FIG. 11 is illustrative of another embodiment of the device 200, which is also discussed above. As illustrated in device 200' of FIG. 11 and as discussed above, in some embodiments, the alloy layer 702 is removed from the device. The alloy layer 702 may be removed with the removal of the dummy layers, discussed above with reference to block 114, or after the removal of the dummy layers. The alloy layer 702 may be removed by suitable wet or dry etching processes. Thus, the WF metal layer 802 may be formed on the first layer 502 (e.g., a capping layer).

Figure 12:
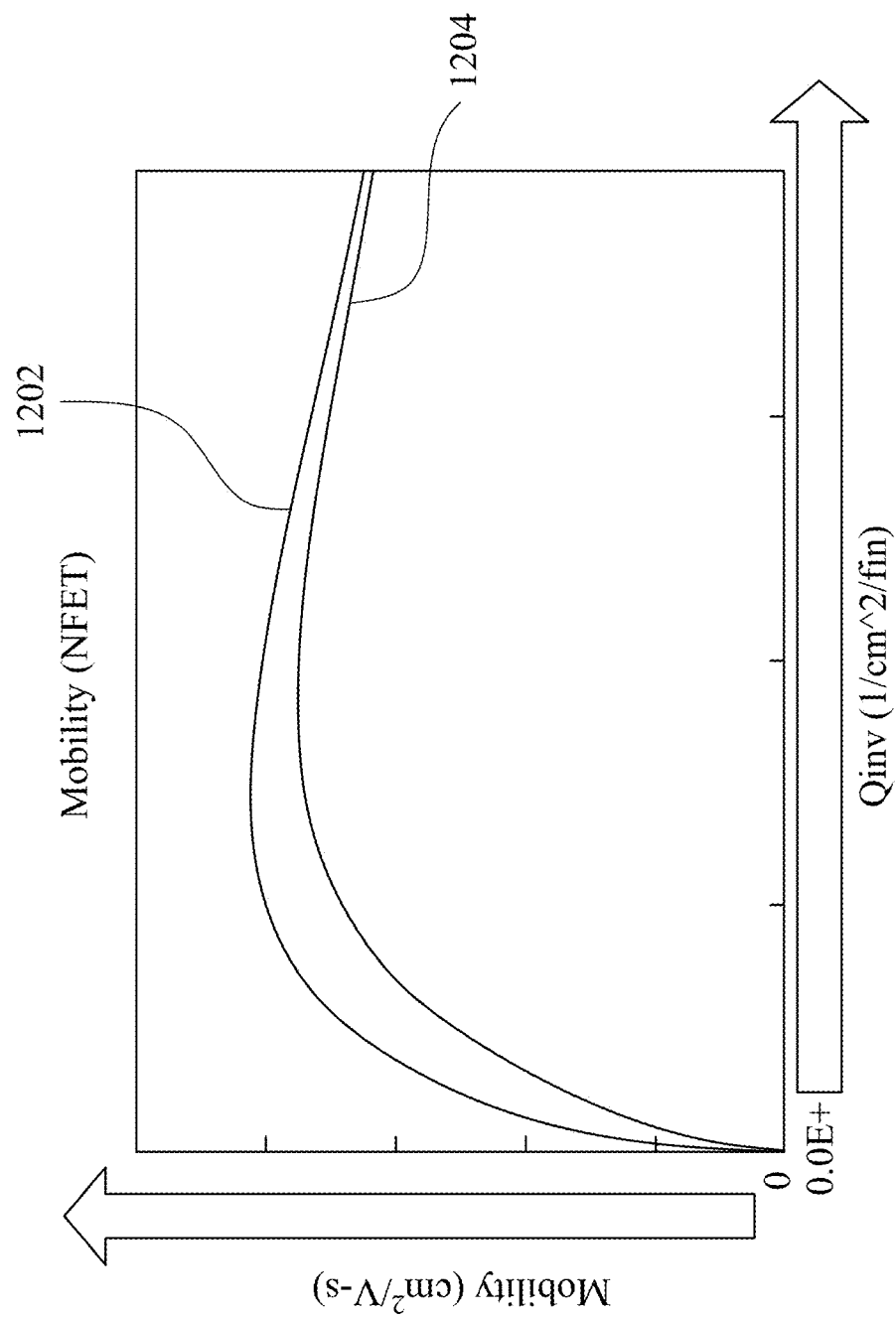
FIGS. 12, 13, and 14 illustrate experimental results of an embodiment of a semiconductor device according to aspects of the present disclosure.
Figure 13:
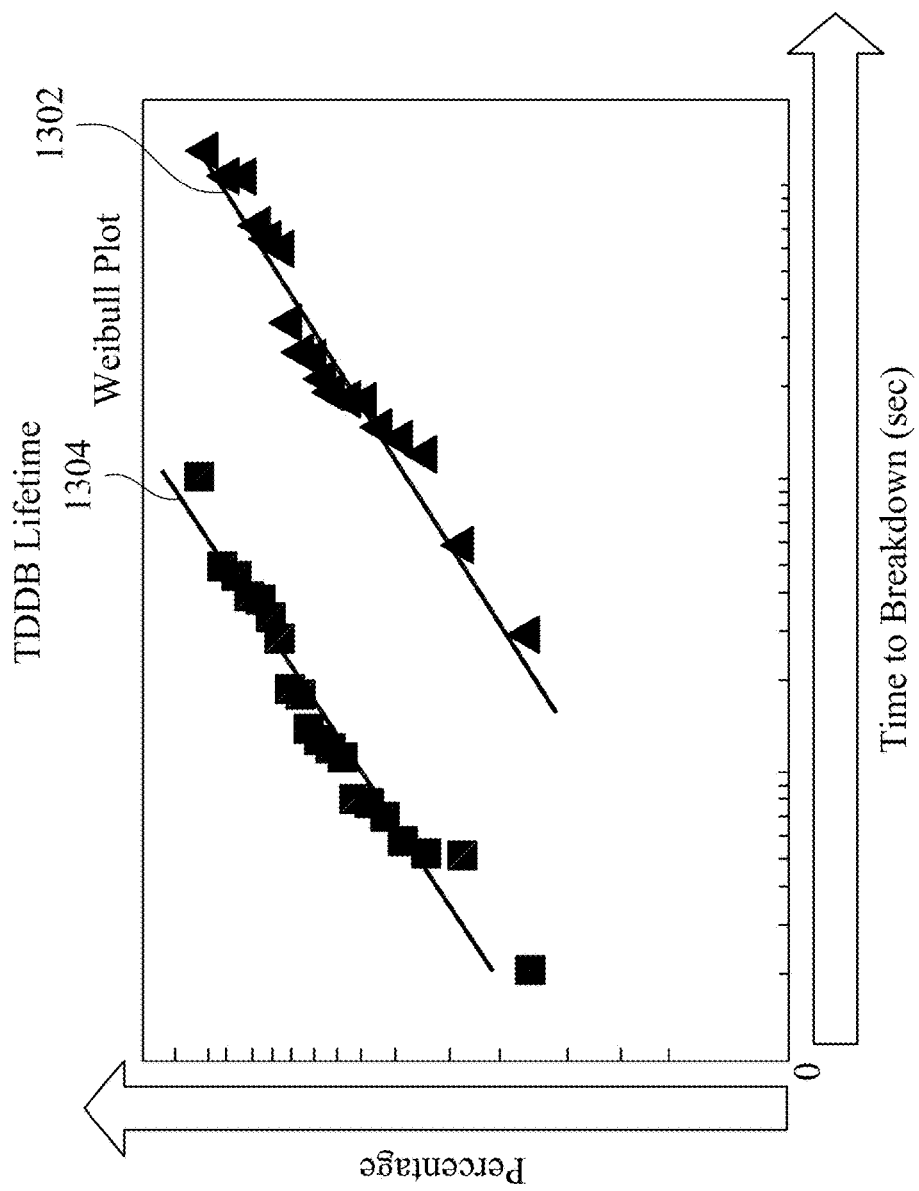

FIGS. 12 and 13 illustrate exemplary experimental embodiments of results of a device fabricated using the method 200 in comparison with other devices. FIGS. 12 and 13 illustrate an improvement in device 200 mobility and time dependent gate dielectric breakdown (TDDB) respectively. FIG. 13 illustrates on a y-axis a cumulative percentage of failures and an x-axis a stress time of devices. Devices substantially similar to the device 200 and fabricated according to the method 100 are illustrated with reference to the data points 1302 in comparison with a conventional device 1304. FIG. 12 illustrates on a y-axis an electron mobility and an x-axis an inversion charge density of the transistor. Device(s) substantially similar to the device 200 and fabricated according to the method 100 are illustrated with reference to the data points 1202 in comparison with a conventional device 1204. FIG. 12 illustrates a mobility boost for 1202.

Figure 14:
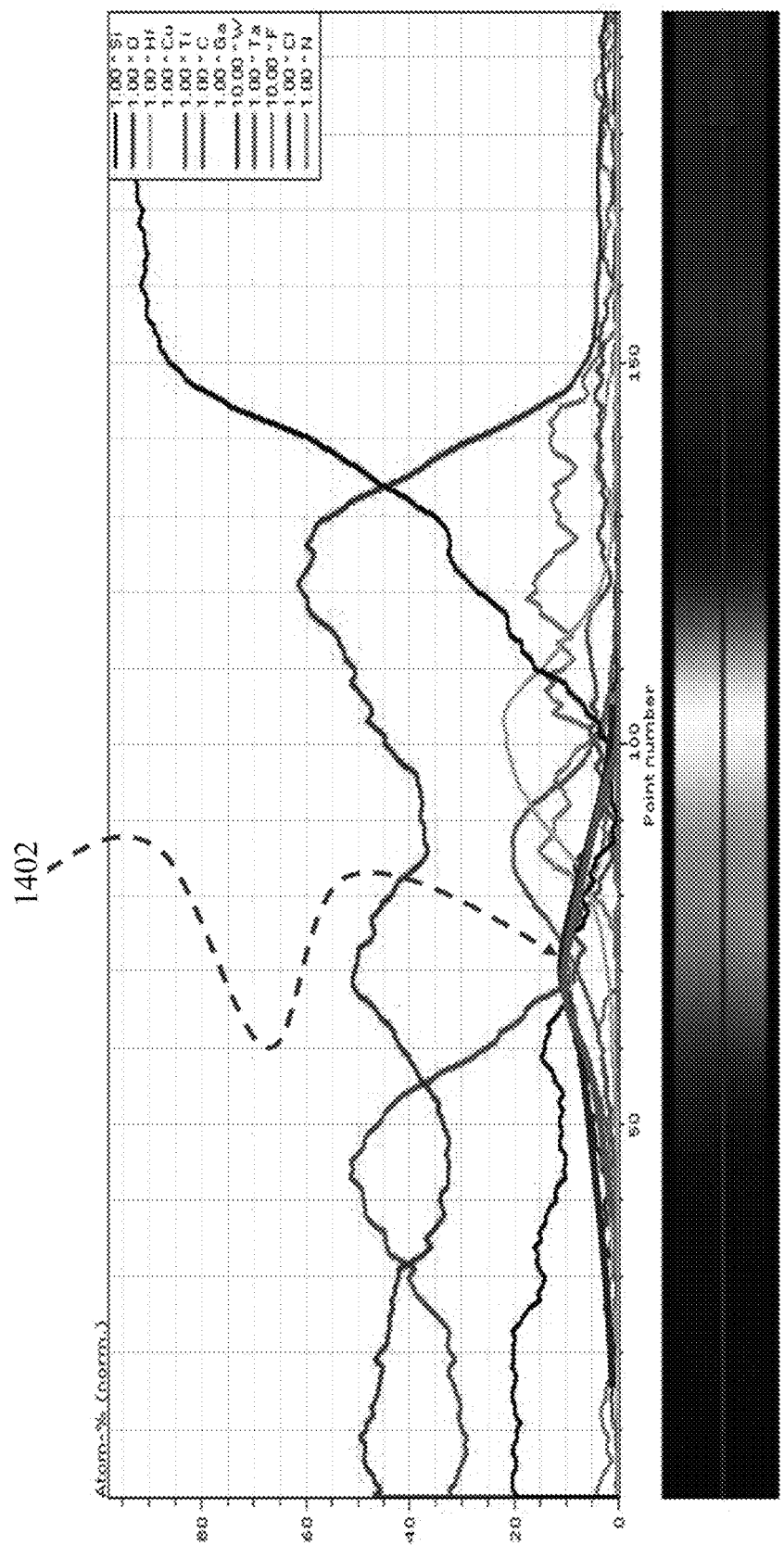

FIG. 14 illustrates an electron energy loss spectroscopy (EELS) analysis of a gate stack with an x-axis of relative location in a gate stack (top to bottom) and the y-axis illustrating the atomic percentage of various atoms. Note that region 1402 illustrates an alloy layer such as alloy layer 702, discussed above, including Ta and W.

Although not intended to be limiting, one or more embodiments of the present disclosure provide many benefits to a semiconductor device and the formation thereof. For example, embodiments of the present disclosure allow for passivation of the gate dielectric layer in a controlled manner. Some embodiments allow for a more uniform introduction of the passivating components as the metal fluorine layer is formed uniformly over the gate dielectric layer. In some embodiments, a uniform introduction of passivating components can be achieved in PMOS and NMOS devices on the same substrate because the process may be performed simultaneously and in some embodiments, with the same geometry (e.g., distance and configuration between the passivating material and the high-k dielectric) in both the PMOS and NMOS devices. For example, each of long channel and short channel devices can, despite differences in gate size, provide the same fluorine doping as the dummy layer is conformally formed on the dielectric layer (e.g., as opposed to a fill metal which may different in configuration between device types). Further, the present method provides for introduction of the passivating component (e.g., fluorine) by a solid precursor drive-in. This alleviants variations to the thermal or vapor anneal introduction of passivating materials. Further, the formation as of the metal fluorine layer as a dummy layer allows for removal of the fluorine source after the anneal. In some embodiments, the fluorine drive in is performed before forming the work function layers thus reducing the interaction between the fluorine and a work function metal, e.g., Al, which may impact the threshold voltage tuning.

In one exemplary aspect, the present disclosure is directed to a method of forming a gate structure of a semiconductor device including depositing a high-k dielectric layer over a substrate. A dummy metal layer is formed over the high-k dielectric layer. The dummy metal layer includes fluorine. A high temperature process is performed to drive the fluorine from the dummy metal layer into the high-k dielectric layer thereby forming a passivated high-k dielectric layer. Thereafter, the dummy metal layer is removed. At least one work function layer over the passivated high-k dielectric layer is formed. A fill metal layer is formed over the at least one work function layer.

In another exemplary aspect, the present disclosure is directed to a method of forming a semiconductor device including depositing a high-k dielectric layer over a substrate. A metal nitride layer is formed over the high-k dielectric layer, the metal nitride comprising a composition including metal denoted M1 (e.g., Ta). A dummy layer is formed over the metal nitride layer, wherein the dummy layer includes a metal fluorine composition comprising a second metal denoted M2 (e.g., W) and fluorine F. A high temperature process drives fluorine F from the dummy layer into the high-k dielectric layer. The metal nitride layer is transformed to form a metal alloy layer including M1 and M2. Then, the dummy metal layer is removed after the performing the high temperature process. At least one work function layer is formed over the metal alloy layer and a fill metal layer is deposited over the at least one work function layer.

In another exemplary aspect, the present disclosure is directed to a method of forming a gate structure of a semiconductor device. The method includes depositing a gate dielectric layer over a substrate and then forming a dummy metal layer over the gate dielectric layer. The dummy metal layer includes tungsten fluoride. A high temperature process drives fluorine from the dummy metal layer into the gate dielectric layer. The dummy metal layer is removed after the performing the high temperature process. After the removing, at least one work function layer is formed over the gate dielectric layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a gate structure of a semiconductor device, comprising:
   depositing a high-k dielectric layer over a substrate;
   forming a dummy metal layer over the high-k dielectric layer, wherein the dummy metal layer includes fluorine and one of aluminum, titanium, or tantalum;
   driving fluorine from the dummy metal layer into the high-k dielectric layer thereby forming a passivated high-k dielectric layer;
   removing the dummy metal layer after the driving the fluorine;
   forming at least one work function layer over the passivated high-k dielectric layer; and
   forming a fill metal layer over the at least one work function layer.

2. The method of claim 1, further comprising:
   forming a metal nitride layer over the high-k dielectric layer underlying the dummy metal layer.

3. The method of claim 2, further comprising:
   prior to forming the metal nitride layer, forming another metal nitride layer over the high-k dielectric.

4. The method of claim 1, further comprising:
   forming a gate contact over the fill metal layer.

5. The method of claim 1, wherein the forming the dummy metal layer further includes forming a blocking layer over the dummy metal layer; and wherein the removing the dummy metal layer includes removing the blocking layer.

6. The method of claim 5, wherein the forming the blocking layer includes depositing TiN.

7. The method of claim 1, further comprising:
   forming a dummy gate structure over the substrate; and
   removing the dummy gate structure to form a trench, wherein the forming the dummy metal layer and forming the at least one work function layer are performed within the trench.

8. The method of claim 7, wherein the forming the fill metal layer over the at least one work function layer includes filling the trench.

9. The method of claim 1, wherein the driving fluorine from the dummy metal layer into the high-k dielectric layer includes performing an anneal process.

10. The method of claim 1, wherein the dummy metal layer is one of $AlF_3$ or $TiF_4$.

11. A method of forming a semiconductor device, comprising:
    depositing a high-k dielectric layer over a substrate;
    forming a metal nitride layer over the high-k dielectric layer, wherein the metal nitride comprising a composition including a first metal M1;
    forming a dummy layer over the metal nitride layer, wherein the dummy layer includes a composition comprising a second metal M2 and fluorine F, wherein M2 is a different metal than M1;

performing a high temperature process driving fluorine F from the dummy layer into the high-k dielectric layer;

modifying the metal nitride layer to form a metal alloy layer including M1 and M2;

removing the dummy metal layer after the performing the high temperature process;

forming at least one work function layer over the metal alloy layer; and forming a fill metal layer over the at least one work function layer.

12. The method of claim 11, wherein the metal alloy layer provides a work function for a gate including the fill metal layer, the at least one work function layer, the metal alloy layer, and the high-k dielectric layer.

13. The method of claim 11, further comprising:
forming a capping layer over the high-k dielectric layer and under the metal nitride layer.

14. The method of claim 13, wherein the forming the capping layer includes depositing a titanium nitride composition.

15. The method of claim 11, wherein the forming the dummy layer includes performing at least one of an atomic layer deposition (ALD) and a chemical vapor deposition (CVD) process directly on the metal nitride layer.

16. The method of claim 11, wherein the forming the dummy layer includes depositing one of aluminum, tantalum, or titanium as M2.

17. A method of forming a gate structure of a semiconductor device, comprising:
depositing a gate dielectric layer over a substrate;
forming a dummy metal layer over the gate dielectric layer, wherein the dummy metal layer includes a metal of aluminum, titanium, or tantalum and fluorine;
performing an anneal driving fluorine from the dummy metal layer into the gate dielectric layer;
removing the dummy metal layer after the performing the anneal; and
after the removing, forming at least one work function layer over the gate dielectric layer.

18. The method of claim 17, further comprising:
forming a tantalum nitride layer over the gate dielectric layer and underlying the dummy metal layer.

19. The method of claim 18, wherein the tantalum nitride layer is transformed to a tantalum alloy layer including tungsten during the anneal.

20. The method of claim 19, wherein the forming that least one work function layer includes forming that at least one work function layer on the tantalum alloy layer.

* * * * *